(12) United States Patent
Tsukanov et al.

(10) Patent No.: US 6,683,344 B2
(45) Date of Patent: Jan. 27, 2004

(54) RUGGED AND FAST POWER MOSFET AND IGBT

(75) Inventors: Vladimir Tsukanov, Mountain View, CA (US); Nathan Zommer, Los Altos, CA (US)

(73) Assignee: IXYS Corporation, Santa Clara, CA (US)

(*) Notice: Subject to any disclaimer, the term of this patent is extended or adjusted under 35 U.S.C. 154(b) by 0 days.

(21) Appl. No.: 10/237,561

(22) Filed: Sep. 6, 2002

(65) Prior Publication Data

US 2003/0067034 A1 Apr. 10, 2003

Related U.S. Application Data

(60) Provisional application No. 60/317,823, filed on Sep. 7, 2001.

(51) Int. Cl.[7] ............................................. H01L 29/78
(52) U.S. Cl. ...................... 257/328; 257/329; 257/401
(58) Field of Search ................... 257/328, 329, 257/401

(56) References Cited

U.S. PATENT DOCUMENTS

| | | | |
|---|---|---|---|
| 4,642,666 A | | 2/1987 | Lidow et al. |
| 4,823,176 A | * | 4/1989 | Baliga et al. ............... 257/335 |
| 4,860,072 A | | 8/1989 | Zommer |
| 4,959,699 A | | 9/1990 | Lidow et al. |
| 5,008,725 A | | 4/1991 | Lidow et al. |
| 5,545,909 A | * | 8/1996 | Williams et al. ........... 257/355 |
| 5,646,418 A | * | 7/1997 | Frazier et al. ................ 257/4 |

* cited by examiner

*Primary Examiner*—Allan R. Wilson
(74) *Attorney, Agent, or Firm*—Townsend and Townsend and Crew LLP

(57) ABSTRACT

A power semiconductor device includes a substrate having an upper surface and a lower surface. A source region of first conductivity is formed within a well region of second conductivity. The source region is provided proximate to the upper surface of the substrate. The well region has a non-polygon design. A gate electrode overlies the upper surface of the substrate. A drain electrode is provided proximate to the lower surface of the substrate.

24 Claims, 6 Drawing Sheets

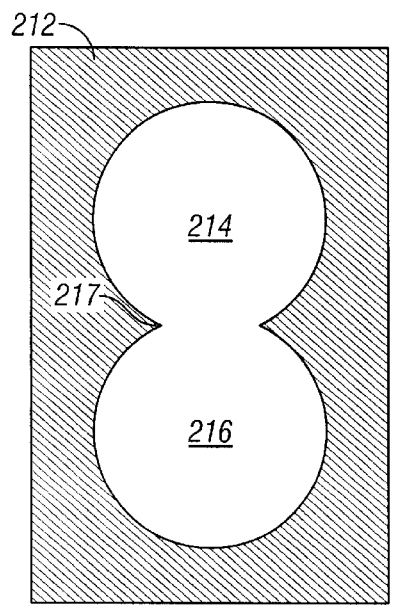
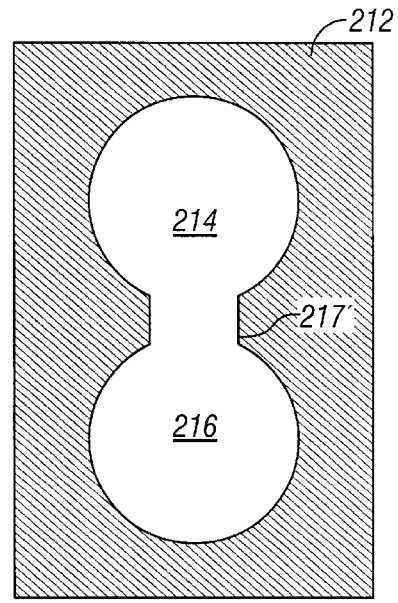
FIG. 6B  FIG. 6C
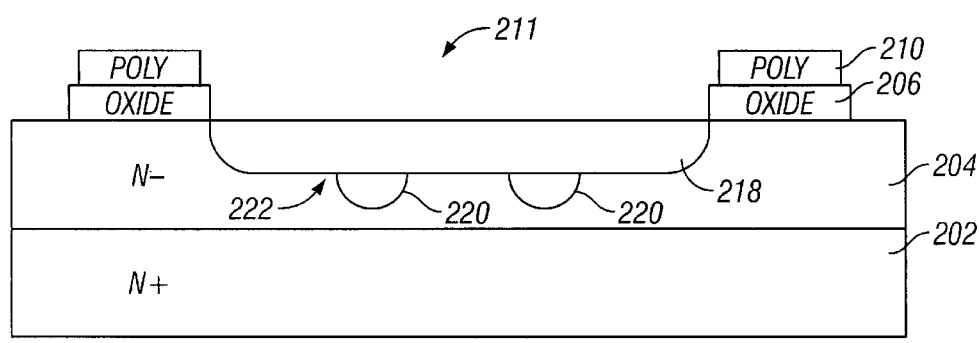
FIG. 7A

RUGGED AND FAST POWER MOSFET AND IGBT

CROSS-REFERENCES TO RELATED APPLICATIONS

This application claims priority to U.S. Provisional Patent Application No. 60/317,823, filed on Sep. 7, 2001, which is incorporated by reference herein for all purposes.

BACKGROUND OF THE INVENTION

The present invention relates to power semiconductor devices.

Power metal oxide semiconductor (MOS) transistors and insulated gate bipolar transistors (IGBTs) can be grouped as either enhancement-mode or depletion-mode devices. Depletion-mode devices inherently include a pair of P/N junctions that form a parasitic bipolar transistor. Generally, it is preferable to prevent the parasitic transistor from being turned on during operation of the power devices, so that the switching speed of the device is not degraded. Also, if the parasitic transistor does turn on, the primary bipolar device may become latched in the on state that may result in destruction of the device.

As used herein, the term "power device" or "power semiconductor device" refers to the power MOS transistor, an IGBT, or other power switching devices.

Attempts have been made to minimize the likelihood of turning on the parasitic transistor. One method has been to short the source electrode of the MOS device to the body region of the device. This effectively shorts the base and emitter of the parasitic transistor together at the surface of the device. However, because of series resistance in the device body, other portions of the base and emitter are not shorted but have a relatively high impedance bridging the two elements. A highly doped region can be added to reduce the effective resistance of the bridging impedance. Another method has been to provide a resistive path between a source contact area and a channel section to provide a ballast voltage, e.g., U.S. Pat. No. 4,860,072, which is incorporated by reference herein for all purposes.

BRIEF SUMMARY OF THE INVENTION

In one embodiment, a power semiconductor device includes a substrate having an upper surface and a lower surface. A source region of first conductivity is formed within a well region of second conductivity. The source region is provided proximate to the upper surface of the substrate. The well region has a non-polygon design. A gate electrode overlies the upper surface of the substrate. A drain electrode is provided proximate to the lower surface of the substrate.

In another embodiment, a power device includes a substrate having an upper surface and a lower surface. A plurality of cells are provided proximate to the upper surface of the substrate. The cells have non-polygon shapes and include source regions defining narrow electrical path within the cells. A drain electrode is provided proximate to the lower surface of the surface.

In yet another embodiment, a power semiconductor device includes a substrate having an upper surface and a lower surface. A source region of N conductivity is formed within a well region of P conductivity. The source region is provided proximate to the upper surface of the substrate and has a first circular path, a second circular path, and a connecting portion connecting the first and second circular paths. A gate electrode overlies the upper surface of the substrate. A drain electrode is provided proximate to the lower surface of the substrate. The connecting portion is configured to provided an increase resistance in the source region. The well region has substantially no linear dimension.

DESCRIPTION OF THE SPECIFIC EMBODIMENTS

Figure 1:
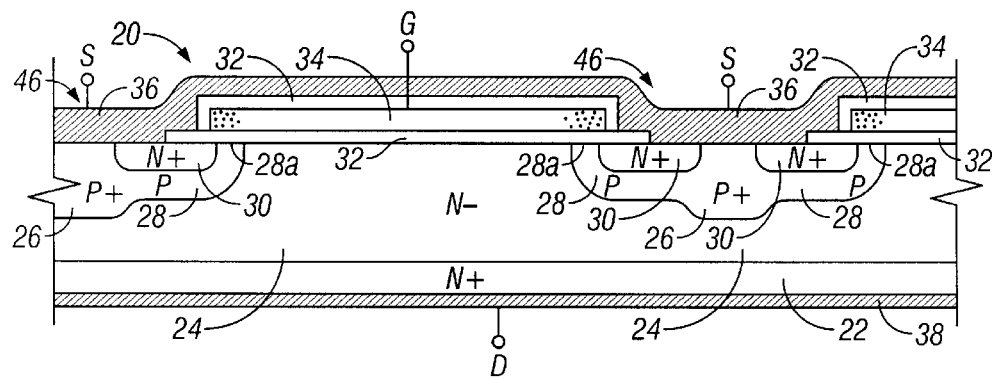
FIG. 1 illustrates a schematic cross-sectional view of a power MOS transistor.

FIG. 1 shows a schematic representation of a power MOS transistor (MOSFET) 20. The MOSFET depicted is a double diffused N channel vertical enhancement mode MOSFET suitable for certain power applications. A single power transistor or device typically includes several hundred to several thousand low-current cells coupled in parallel to form a transistor having high current capabilities. Each cell includes a source electrode in the form of a source metallization 36 surrounded by a gate electrode 34. All the cells are coupled to a common drain electrode 38 that is formed at the bottom of the die. A single cell can function alone as a low current MOSFET. FIG. 1 shows approximately one and one-half cells 46.

MOSFET 20 is fabricated from a silicon wafer which is heavily doped N+. A lightly doped N− expitaxial layer 24 is formed on the N+ substrate 22. A thin oxide layer is formed on which a silicon nitride layer is deposited and patterned to define the active area. Then, the gate oxide is formed on which polysilicon 34 is deposited and patterned to define the P well area. Then, using the polysilicon as a mask, a shallow and light P doping is performed by ion implantation, followed by a heavier and deeper P+ implant step. A single diffusion step is then performed to form regions 28 and 26, respectively. An oxide layer 32, having a central opening associated with each cell, functions as a diffusion mask for P diffusion 28. As shown in FIG. 1, diffusion 28 migrates laterally under the oxide and polysilicon layer to form a short channel section 28a that extends around the periphery of the cell.

Diffusion 28 is followed by an N+ diffusion 30 utilizing an oxide mask. Diffusion 30 also extends laterally under the oxide and polysilicon layer, but to a lesser extent than diffusion 28. Channel region 28a is formed under oxide layer 32, intermediate N+ region 30 and epitaxial N– layer 24. N+ region 30, which abuts the top surface of the wafer, forms the source region of the cell. A segment of P+ region 26 extends up through N+ region 30 to form a contact area for the body section of the cell. A source metallization 36 is formed over the exposed portion of the N+ source region 30 and P+ body region of each cell so as to provide a common source electrode. The highly doped silicon in combination with a metallization layer forms an ohmic (substantially non-rectifying) contact.

The polysilicon functions as a gate 34 and is positioned over channel region 28a and is insulated from the channel region by oxide layer 32. Gate electrode 34 extends over the surface of the device so as to form a common gate electrode for all cells 46 of the device. A metallization layer 38 is formed on the back of the die to form a drain electrode common to each cell 46 of the device.

When a positive potential is applied to the gate electrode 34, with respect to source electrode 36, electrons in body region 28 are attracted to the gate electrode. The excess electrons cause the channel region 28a immediately below the gate electrode to invert from P to N type conductivity, thereby forming an electrical path between the source and drain. When the gate potential is removed, the inversion layer disappears and section 28a is no longer conductive.

The FIG. 1 device is plagued with a parasitic bipolar transistor that is in parallel with the MOS device. In the case of the N channel MOS device 20, the parasitic transistor is an NPN transistor. Source region 30, regions 26/28, and regions 22/24 form the emitter, base, and collector of the transistor, respectively. If the MOS device is P channel, the parasitic transistor would be a PNP transistor.

Figure 2:
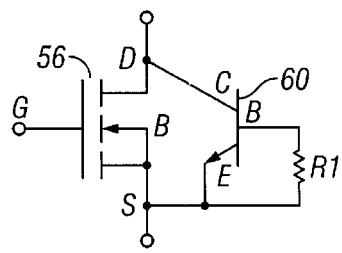
FIG. 2 illustrates a schematic diagram of a simplified equivalent circuit for the power MOS transistor of FIG. 1.

FIG. 2 schematically depicts the relationship between an N channel MOS transistor 56, corresponding to the MOS transistor 20, and an parasitic NPN bipolar transistor 60 associated with the MOS transistor 56. The drain and collector of the two respective devices are effectively shorted, as are the source and emitter. The base (MOS body) of the bipolar transistor is connected to the emitter (MOS source) through an effective resistance represented by resistor R1.

If current through resistor R1 is sufficiently large to forward bias the emitter/base junction of transistor 60 (about 0.7 volts), transistor 60 will turn on. This may occur because of current coupled to resistor R1 by way of the effective drain region 24 to body region 26/28 junction capacitance. If parasitic transistor 60 is permitted to turn on while MOS transistor 56 is conducting, the relatively slow turn-off time of the bipolar device would degrade the operation of the MOS device. In some instances, the MOS device may even be destroyed.

Figure 3:
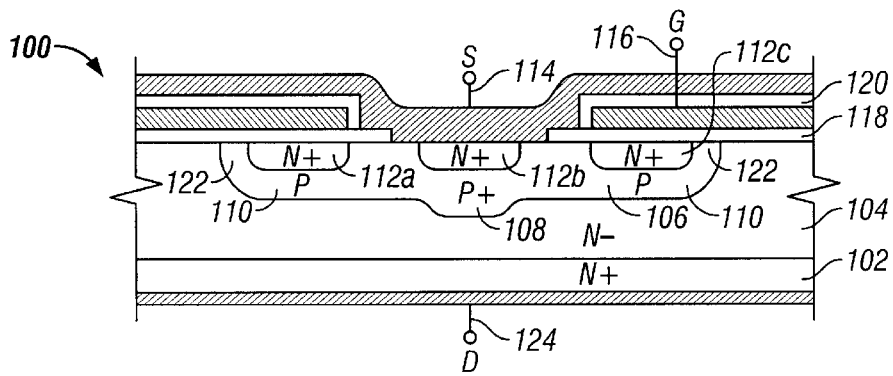
FIG. 3 is a schematic cross-sectional view of a power semiconductor device or power MOS transistor according to one embodiment of the present invention.

FIG. 3 shows a schematic cross-sectional representation of a power MOS transistor (MOSFET) 100 according to one embodiment of the present invention. A single power transistor or device typically includes a plurality of low-current cells, e.g., thousands or more, coupled in parallel to form a transistor having high current capabilities. Each cell includes a source electrode in the form of a source electrode surrounded by a gate electrode, generally of polysilicon material. All the cells are coupled to a common drain electrode that is formed at the bottom of the die. A single cell, as shown in FIG. 3, can function alone as a low current MOSFET. The cells in the MOS device 100 is provided with a source region having a significant resistance $R_{N+}$ to prevent forward biasing of and turning on the emitter/base regions of the parasitic transistor.

Power MOS device 100 is formed on an N+ substrate 102 on which an N– layer 104 is provided, e.g., by epitaxial growth. Alternatively, a MOS device may be formed on an N+ substrate that does not have an N– layer thereon. Referring back to MOS device 100, a P well region 106 is formed within N– layer 104. The P well region includes a P+ region 108 formed at a relatively deeper region and a P– region 110 formed at a relatively shallower region. An N+ well region or source region 112 (denoted as a left portion 112a, a center portion 112b, and right portion 112c) is formed within the P well region. Although the source region appears as three discrete regions in FIG. 3, it is a continuous region to provide a continuous electrical path, as will be explained later.

A source electrode 114 is formed over an upper surface of the substrate and contacts center portion 112b of the source region and a portion of P well region 106. A gate electrode 116, generally of polysilicon, is provided at the periphery of P well region 106 overlying the upper surface of the substrate. The gate electrode is electrically isolated from the substrate and P well region by a lower oxide layer 118 and from the source electrode by an upper oxide layer 120. A channel region 122 is provided in the P well region below the gate electrode, so that an electrical path may be formed therein when a sufficient voltage is applied to the gate electrode. A drain electrode 124 is provided at a lower surface of the substrate.

Figure 4:
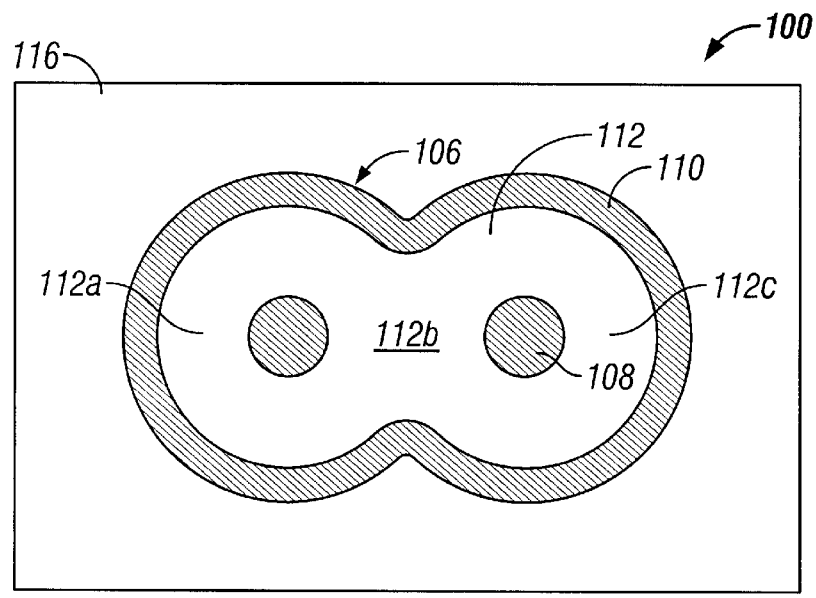
FIG. 4 illustrates a schematic top view of the power MOS transistor of FIG. 3.

FIG. 4 depicts a schematic top view of the MOS device of FIG. 3 that has been delayered to show N+ well region 112 having portions 112a, 112b and 112c and P well region 106 having P+ region and P– region 110. P well region 106, representing the shape of a cell in MOS device 100, has a non-polygon design and substantially no sharp. In one embodiment, the P well region resembles the shape of a peanut or two overlapping circles. The P well region is substantially bounded by a polysilicon layer or gate electrode 116. The N+ region is formed within the P well region and has a non-polygon design. In particular, the N+ region is configured to resemble the shape of figure 8, where the centers of the two circular regions or lobes are of different conductivity; i.e., they are part of the P well region. Accordingly, the P well region bounds the N+ well region outwardly and inwardly, so that a narrow, extended electrical path is provided to increase the resistance of the N+ well or source region to prevent the parasitic transistor from turning on, as explained in more detail subsequently.

Figure 5:
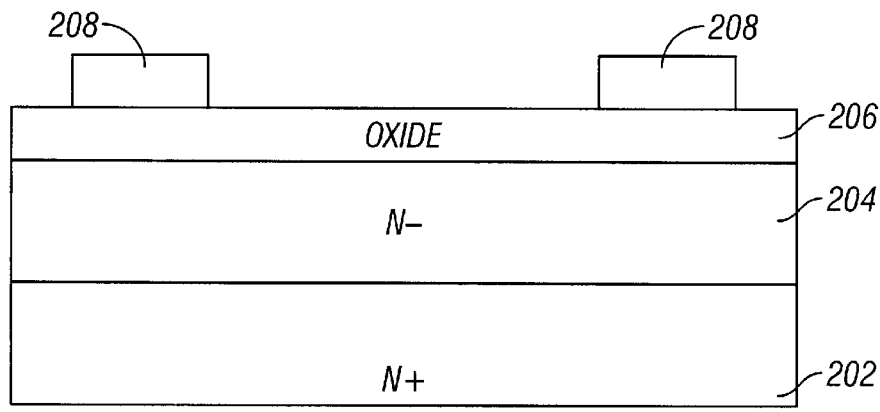
FIGS. 5–8B illustrate a method of forming a power semiconductor device or power MOS transistor according to one embodiment of the present invention.

FIGS. 5–9 illustrate a fabrication process of MOS device 100 according to one embodiment of the present invention. A silicon substrate 202 having an N+ conductivity is provided, whereon a lightly doped N– expitaxial layer 204 is formed. A thin oxide layer 206 is formed on an upper surface of the N– layer. A silicon nitride layer 208 is deposited and patterned (FIG. 5). The oxide layer, in turn, is patterned using the patterned nitride layer to define the active area (FIG. 6A). A polysilicon layer 210 is deposited over the patterned oxide layer. The polysilicon layer is patterned to have an opening 211 and define a gate electrode 212 that corresponds to the gate electrode 116. In another embodiment, the polysilicon layer 210 may be formed over an unpatterned oxide layer, so that the polysilicon is patterned before the oxide layer.

Referring to FIG. 6B, the shape of the opening defined by the pattern polysilicon layer or gate electrode 212 is a non-polygon, e.g., a peanut or two-overlapping circles. The opening includes a first substantially circular region or first circular lobe 214 and a second substantially circular region or second circular lobe 216 that together define an initial shape of a P+ well region to be formed. The opening further includes a narrow connecting region 217. Its narrow width provides an increased the resistance in the N+ well region that is formed on top of the P well region, as explained in more detail later. In one embodiment, the connecting region may have a non-curved feature 217' as in FIG. 6C. During the diffusion step, the non-curved feature is made to substantially resemble connecting region 217 due to the outward movement of the dopants. A power MOS device, such as MOS device 100, has an array of such openings in the polysilicon layer, either equally spaced from each other or in a nonsymmetrical array. These openings correspond to cells of the MOS device.

Figure 6A:
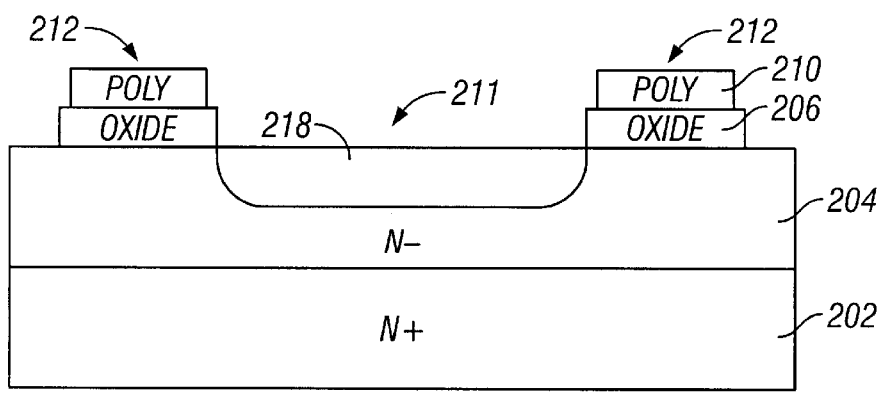
Figure 7B:
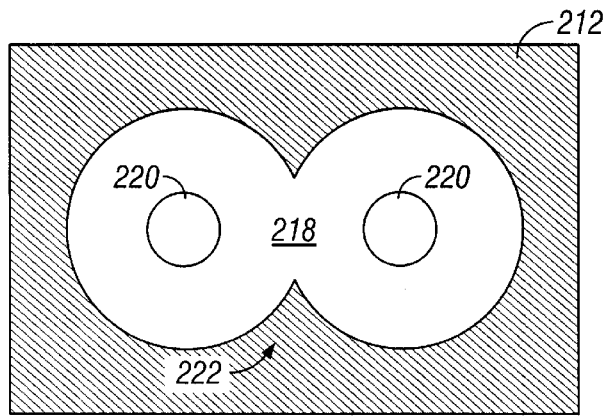

Referring to FIGS. 6A and 6B, P type dopants, e.g., boron, are implanted lightly or at a first concentration level into opening 211 using a relatively low energy to form a shallow P− region 218. As a next step, P type dopants are implanted into selected regions of the opening at a second or greater concentration using a relatively high energy to implant the dopants deeper into the N− layer, thereby forming P+ regions 220 (FIGS. 7A and 7B). A P well region 222 comprise these two regions: the P− and P+ regions.

The substrate is annealed to drive or diffuse the dopants in the P− and P+ regions. The dopants are driven vertically and horizontally in the N− layer; i.e., P well region 222 expands outwardly. As a result, a portion of the P well region extends underneath the gate electrode 212 to form a channel region, e.g., channel region 122 in FIG. 3, of the MOS device.

In the present embodiment, P+ regions 220 are provided to reduce the effective base resistance of the parasitic transistor to prevent it from being turned on during the operation of the MOS device. In one embodiment, the dopants from the P+ regions penetrate the MOS channel region to increase the threshold voltage of the device. A MOS device having a higher threshold voltage has higher noise immunity in power electronic circuits since it would require noise having higher energy to trigger the device on.

Figure 8A:
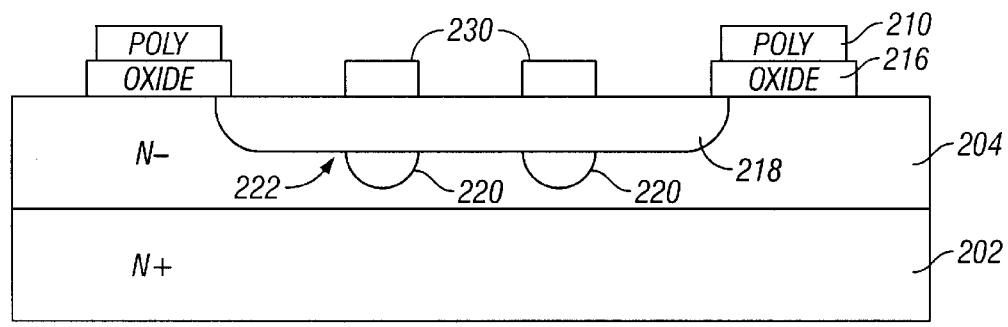
Figure 8B:
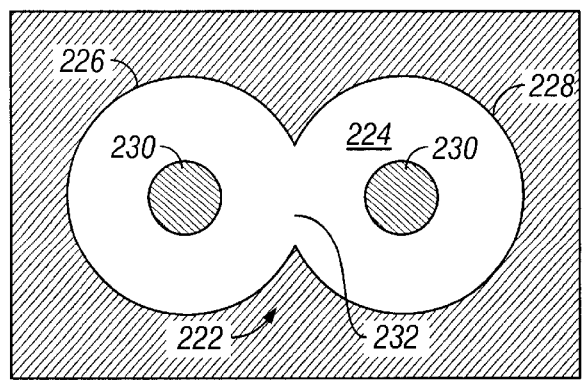

FIG. 8A depicts a schematic cross-sectional view of a cell in a partially completed MOS device, whereon an N+ region or source region is formed within the P well region. N dopants are implanted using relatively low energy to form a doped region abutting the upper surface of the N− layer. FIG. 8B depicts a schematic top view of FIG. 8A illustrating an N+ well region 224 that is configured to have a shape of the figure 8. That is, the N+ well region includes a first circular lobe 226 and a second circular lobe 228 that have been converted to an N type well. Each circular lobe is bounded inside by a portion of the P well region that has not been converted to a N type well.

In one embodiment, the portion of P well region 222 that has not been converted to the N type is positioned substantially at the center of each circular lobe 226. A blocking mask, e.g., a patterned oxide layer 230, is used to block the N dopants from being implanted at the central areas of the circular lobes 226 and 228. The N+ well region, accordingly, is provided with two circular electrical path that is coupled at a connecting region 232 corresponding to center portion 112b of the source region 112 in FIG. 3.

Figure 9:
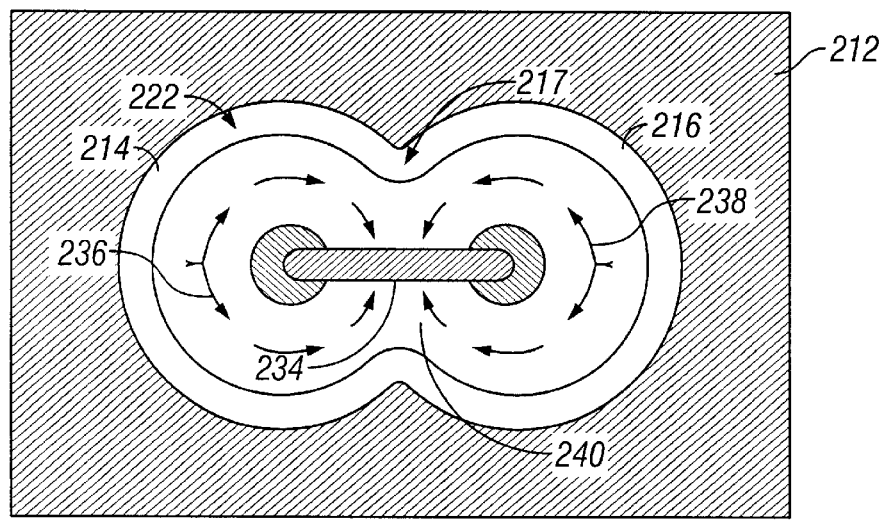
FIG. 9 illustrates a flow of electrical current in a power semiconductor device or power MOS transistor according to one embodiment of the present invention.

A source electrode (not shown) makes a contact 234 with the source region or N+ well region at the connecting region 232 and portions of the P well region (FIG. 9). A drain electrode (not shown) is formed at a lower surface of the substrate. Accordingly, MOS device 100 of FIG. 3 is formed. The fabrication process described above is merely one of plurality of methods that may be used to fabricate the MOS device. Other fabrication process having different sequence of steps or slightly different steps may be used.

Referring to FIGS. 3 and 9, electricity flows from drain electrode 124 through channel region 122, through source region 224, and exits to the source electrode 114 via the contact 234 contacting the source region at the connecting region 112b or 232. The source region having a shape of the figure 8 has two relatively narrow, elongated electrical paths 236 and 238 that add to on resistance of the source region. In addition, the narrow connecting region 217 of the P well region and a corresponding narrow connecting region 240 of the source region crowds the electrons flowing in electrical paths 236 and 238 which further increases the resistance of the source region. This resistance adds extra source ballasting effect that provides a more rugged power MOS device, as explained in more detail later in connection with FIG. 11.

Figure 10:
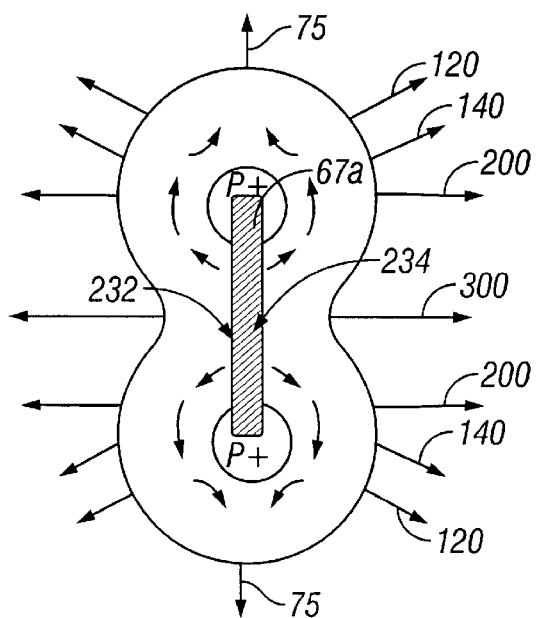
FIG. 10 illustrates a flow of electrons in a power semiconductor device or power MOS transistor according to one embodiment of the present invention.

FIG. 10 illustrates the flow of current in the cell in another way for further clarification. The electron flow streams from the source electrode 114 via its contact 234 at the connecting region 232. The flow divides into two streams, one for each circular lobe of the source region. The electrons flow out of the source region through the channel region that is formed under the polysilicon gate when the device is turned on. As the electrons flow further away from the central region 232, there are less and less electrons left since they are siphoned off to the surrounding P well region or channel. The net effect is that the flow of electrons through the MOS channel of said MOS cell is not uniform. This non-uniform electron flow through the channel is represented in FIG. 10 by the arrows that are pointing outward. The sizes of arrows represent approximately, not to scale, the electron current flow in the corresponding channel region. The numbers provided next to the arrows represent approximate magnitudes of the electron currents.

Figure 11:
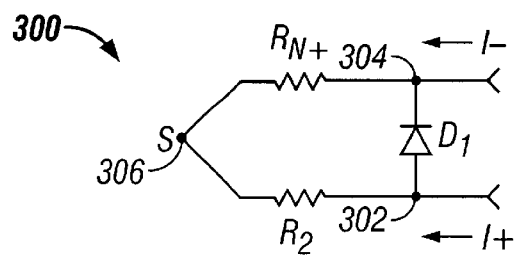
FIG. 11 illustrates a schematic diagram of a simplified equivalent circuit for a power semiconductor device or power MOS transistor according to one embodiment of the present invention

FIG. 11 depicts a schematic equivalent circuit 300 of the MOS device 100 according to one embodiment of the present invention. Diode D1 represents the base/emitter junction of the parasitic transistor. A node 302, at the diode D1 anode, is located at the channel region 122 of the device. Node 302 is coupled to the source metallization 114 at a node 306 through resistance R2 resulting from the P+ and P regions 108 and 110. Current flow through resistance R2 is in the form of positive (hole) carriers since the flow is through material of P type conductivity, and is represented accordingly by I+.

In addition, a significant series resistance $R_{N+}$ is provided between nodes 304 and 306. This resistance is formed in the N+ source region 112. The narrow current paths 236 and 238 and the narrow connecting region 240 contributes to the increased resistance of $R_{N+}$. The current path from the contact 234 and the channel regions at the tips of the source regions are extended by the P well region provided at the central area of the circular lobes of the source region.

Current flow through resistance $R_{N+}$ is in the form of negative (electron) carriers and is represented accordingly by I−.

The electron flow I− through resistance RN+ creates a voltage drop which opposes the drop across resistance R2 and thus tends to reverse bias diode D1 thereby causing the parasitic transistor to remain turned off. Without resistance $R_{N+}$, the diode D1 is more likely to be forward biased and then turn on the parasitic transistor, thereby degrading the operation of the MOS device.

Figure 12:
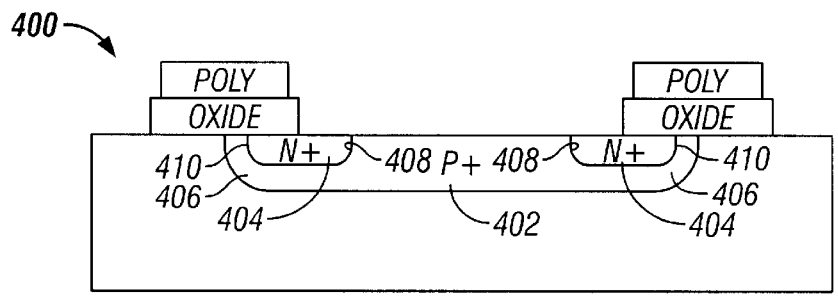
FIG. 12 is a schematic cross-sectional view of a power semiconductor device or power MOS transistor according to another embodiment of the present invention.

FIG. 12 depicts a cross-section of a MOS device 400 having a modified P+ region 402, so that it abuts an N+ region 404 according to another embodiment of the present invention. The N+ region or source region is provided on an upper surface of the P+ region of a P well region. Providing P+ region under the N+ region increases the selective compensation of the P+ doping with the N+ doping, the N+ region with higher resistance in areas where there is relatively high carrier compensation, which is in the vicinity close to the central area of the cell.

As a result, the depth of the N+ or source region varies as one moves from the center of P+ region 402 to a channel region 406. The N+ region at a first end 408 and a second end 410 have different depth. The first end 408 proximate to the center of P+ region 402 is shallower than the second end remote from the center of P+ region 402. The shallower, first end has relatively higher sheet resistance then the deeper, second end 410, thereby creating an added degree of ballasting effect for increased device ruggedness. In other words, the varying depths of the source region provides selectively higher resistance in a portion of the source region that are removed from the channel region. This configuration may be used to control the resistance in the N+ layer (or $R_{N+}$ of FIG. 11) without significantly influencing the portion of the N+ region that acts as the source of the respective channel region.

Figure 13:
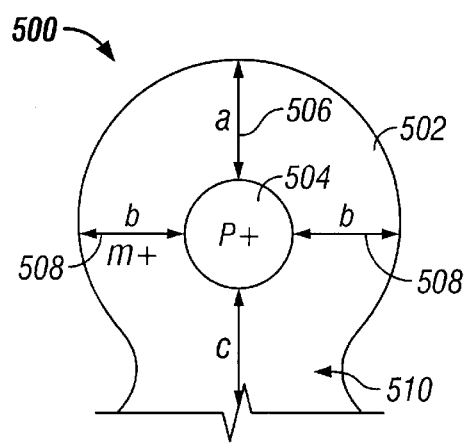
FIG. 13 is a schematic top view of a power semiconductor device or power MOS transistor having varying channel widths according to another embodiment of the present invention.

Referring to FIG. 13, a MOS device 500 includes an N+ region 502 having varying width around a P well region 504 according to one embodiment of the present invention. An upper portion 506 of the N+ region has a first width, a side portion 508 has a second width, and a lower portion 510 has a third width. In one embodiment, the first, second and third widths are different or substantially the same. In another embodiment, the first width is smaller than the second width, and the second width is smaller than the third width. Alternatively, the second width and the third width may be substantially the same. A reduced width may be provided at the upper portion of the source region since the current at that part of the cell is the smallest, as shown by FIG. 10. The width along various parts of the source region may be adjusted according to the current magnitude indicated by FIG. 10 to from a MOS device having a smaller cell size or smaller overall P well region, which reduces the output capacitance of the device and improves its switching efficiency in high frequency operation.

Figures 14A, 14B, 14C, 14D:
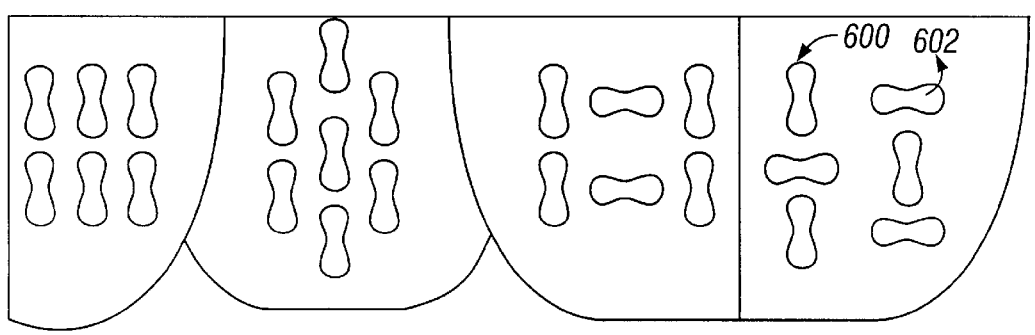
FIGS. 14A–14D are schematic top views of power semiconductor devices or power MOS transistors having various different cell arrangements according to another embodiment of the present invention.

FIGS. 14A–14D illustrate various the arrangements the non-polygon cell array configuration according to one embodiment of the present invention. The cells may be arranged in a substantially equal distance from each other or in variable distances from each other. The density of these cells can vary in different segment of said power MOSFET or IGBT according to the desired performance of the device. The cells can be packed at a higher density along the periphery of the device and at a lower density in the central areas of the device. Furthermore, the angular rotation of the cells relative to each other can also be varied. For example, FIG. 14D shows a 90 degree relative rotation of a cell 600 vs. a cell 602. The neighboring cells can be rotated at 60 degrees or 30 degrees to achieve the desired device performance. These geometrical degrees of freedom enable the designer to optimize the performance of the devices to breakdown voltage range, on resistance, capacitance, switching speed, and the like.

While the invention has been particularly illustrated and described with reference to specific embodiments thereof, it will be understood by those skilled in the art that the foregoing and other changes in the form and details may be made therein without departing from the spirit or scope of the invention. Therefore, the scope of this invention should not be limited to the embodiments described above, and should instead be defined by the following claims.

What is claimed is:

1. A power semiconductor device, comprising:

a substrate having an upper surface and a lower surface;

a source region of first conductivity formed within a continuous well region of second conductivity, the source region provided proximate to the upper surface of the substrate, the source region having a first region, a second region, and a third region, the well region having a non-polygon design;

first and second gate electrodes overlying the upper surface of the substrate; and a drain electrode provided proximate to the lower surface of the substrate, wherein the first region of the source region and the first gate electrode define a first channel, and the second region of the source region and the second gate electrode define a second channel.

wherein the first and second channels are defined within the well region.

2. The device of claim 1, wherein the well region is a P well region and the source region is an N well region.

3. The device of claim 1, wherein the well region has a shape of peanut or two overlapping circles.

4. The device of claim 1, wherein a plurality of the well regions are provided proximate to the upper surface wherein a plurality of the source regions are provided.

5. The device of claim 4, wherein the plurality of the well regions define cells of the power device, the cells being coupled to the drain electrode.

6. The device of claim 1, wherein the gate electrode is a patterned polysilicon layer, the gate electrode having an opening that is substantially non-polygon.

7. The device of claim 1, wherein the source region is an N+ region having a shape of figure 8.

8. The device of claim 7, wherein the N+ region includes two circular lobes, each lobe having an outer perimeter and an inner perimeter that are both bounded by the well region to define a circular electron current path.

9. The device of claim 8, wherein the well region includes a P+ region and a P region, wherein the P+ region is provided deeper into the substrate than the P region.

10. The device of claim 9, wherein the source region is provided overlying the P+ region.

11. The device of claim 1, wherein the well region includes a first circular lobe, a second circular lobe, and a connecting region joining the first and second lobes, wherein the connecting region is substantially narrower than a diameter of the first or second lobe to provide an electrical crowding effect at the connecting region.

12. A power device, comprising:

a substrate having an upper surface and a lower surface;

a plurality of cells provided proximate to the upper surface of the substrate, the cells having non-polygon shapes and including source regions defining narrow electrical path within the cells; and a drain electrode provided proximate to the lower surface of the surface, wherein the source region is formed within a continuous well region, the source region including a portion, a second portion, and a third portion, the first portion defining a first circular path, the second portion defining a second circular path, the third portion connecting the first and second circular paths to define a continuous current path.

13. A power semiconductor device, comprising:

a substrate having an upper surface and a lower surface;

a source region of N conductivity formed within a well region of P conductivity, the source region provided proximate to the upper surface of the substrate and having a first circular path, a second circular path, and a connecting portion connecting the first and second circular paths;

a gate electrode overlying the upper surface of the substrate; and a drain electrode provided proximate to the lower surface of the substrate, wherein the connecting portion is configured to provided an increase resistance in the source region, wherein the well region has smooth profiles without angular edges.

14. The device of claim 13, wherein the well region has a shape of peanut or two overlapping circles.

15. The device of claim 13, wherein the well region includes a first circular section, a second circular section, and a connecting section connecting the first and second circular sections, wherein the connecting section has a width that is substantially less than the a diameter of the first or second circular section.

16. The device of claim 15, wherein the well region defines a cell of the power device, where the power device has a plurality of cells.

17. The device of claim 13, wherein the gate electrode is polysilicon and is patterned to define the well region.

18. The device of claim 17, wherein the gate electrode includes an opening having a first circular opening, a second circular opening, and a connecting portion opening, wherein the connecting portion opening has a linear dimension.

19. The device of claim 13, wherein at least one path of the source region has a varying depth.

20. The device of claim 19, wherein the at least one path includes an inner side having a first depth and an outer side having a second depth, the outer side being proximate to a channel region of the device, the first depth being less than second depth.

21. A power semiconductor device, comprising:

a substrate having an upper surface and a lower surface;

a source region of first conductivity formed within a continuous well region of second conductivity, the source region provided proximate to the upper surface of the substrate, the source region having a first region, a second region, and a third region;

first and second gate electrodes overlying the upper surface of the substrate; and a drain electrode provided proximate to the lower surface of the substrate, wherein the first region of the source region and the first gate electrode define a first channel, and the second region of the source region and the second gate electrode define a second channel.

22. The power device of claim 21, wherein the first, second, and third regions are a continuous region formed with the region and define a continuous path.

23. The power device of claim 21, wherein the well region includes a P+ region and a P region, wherein the P+ region is provided deeper into the substrate than the P region.

24. A power semiconductor device, comprising:

a substrate having an upper surface and a lower surface;

a source region of N conductivity formed within a well region of P conductivity, the source region provided proximate to the upper surface of the substrate and having a first circular path, a second circular path, and a connecting portion connecting the first and second circular paths;

a gate electrode overlying the upper surface of the substrate, the gate electrode including an opening having a first circular opening, a second circular opening, and a connecting portion opening, wherein the connecting portion opening has a linear dimension and is configured to provided an increase resistance in the source region; and a drain electrode provided proximate to the lower surface of the substrate.

* * * * *